US012463313B2

(12) United States Patent
Fu et al.

(10) Patent No.: US 12,463,313 B2
(45) Date of Patent: Nov. 4, 2025

(54) INTEGRATED LOW-PASS AND BAND-PASS FILTER UNIT FORMED BY SHEET METAL COATED WITH DIELECTRIC MATERIAL

(71) Applicant: Telefonaktiebolaget LM Ericsson (publ), Stockholm (SE)

(72) Inventors: Jun Fu, Beijing (CN); Weidong Wang, Beijing (CN); Xueyuan Zhang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 2 days.

(21) Appl. No.: 18/692,276

(22) PCT Filed: Apr. 26, 2022

(86) PCT No.: PCT/SE2022/050401
§ 371 (c)(1),
(2) Date: Mar. 14, 2024

(87) PCT Pub. No.: WO2023/043350
PCT Pub. Date: Mar. 23, 2023

(65) Prior Publication Data

US 2024/0267029 A1 Aug. 8, 2024

(30) Foreign Application Priority Data

Sep. 14, 2021 (WO) ................ PCT/CN2021/118317

(51) Int. Cl.
*H01P 1/208* (2006.01)
*H01P 7/06* (2006.01)
(Continued)

(52) U.S. Cl.
CPC .............. *H01P 1/2084* (2013.01); *H01P 7/06* (2013.01); *H01Q 23/00* (2013.01); *H03H 9/54* (2013.01)

(58) Field of Classification Search
CPC .......... H01P 1/2084; H01P 1/207; H01P 7/06; H03H 9/54
See application file for complete search history.

(56) References Cited

U.S. PATENT DOCUMENTS 5,225,799 A * 7/1993 West ....................... H01P 1/205
333/202
5,719,539 A * 2/1998 Ishizaki .............. H01P 1/20381
333/204
(Continued)

FOREIGN PATENT DOCUMENTS

CN 118610716 A * 9/2024 .......... H01P 1/20327
GB 2579425 A * 6/2020 ................ H01P 7/06
(Continued)

OTHER PUBLICATIONS

International Search Report and Written Opinion, Application No. PCT/SE2022/050401, Aug. 5, 2022, 13 pages.
(Continued)

*Primary Examiner* — Ab Salam Alkassim, Jr.
(74) *Attorney, Agent, or Firm* — Nicholson De Vos Webster & Elliott LLP

(57) ABSTRACT

An integrated low-pass and band-pass filter unit comprises an inner cavity formed by a shell of conductive materials; one or more low-pass resonators and two or more band-pass resonators comprised in the inner cavity. The low-pass and band-pass resonators are integrally formed by electroplated sheet metal material, and a part of each of the low-pass and band-pass resonators is coated with dielectric material. The two or more band-pass resonators are arranged at two sides of the inner cavity such that at least two resonators are aligned to face each other. The integrated low-pass and band-pass filter unit further comprises a first separator of electroplated sheet metal arranged in the inner cavity between the low-pass resonators and band-pass resonators
(Continued)

and a second separator of electroplated sheet metal arranged in the inner cavity between the band-pass resonators at the two sides of the inner cavity.

18 Claims, 11 Drawing Sheets

(51) Int. Cl.
*H01Q 23/00* (2006.01)
*H03H 9/54* (2006.01)

(56) References Cited

U.S. PATENT DOCUMENTS 5,841,330 A 11/1998 Wenzel et al.
6,356,168 B1 * 3/2002 Barnett ................. H01P 11/007 333/204
7,456,711 B1 * 11/2008 Goldsmith ............ H01P 1/2016 333/209
7,915,977 B2 * 3/2011 Rhodes ..................... H01P 1/20 333/202
11,223,094 B2 * 1/2022 Tamiazzo .............. H01P 11/007
12,040,523 B2 * 7/2024 Jia ........................... H01P 1/207
12,040,524 B2 * 7/2024 Karhu ..................... H01P 1/207
2003/0206082 A1 * 11/2003 Chen ....................... H01P 1/208 333/208
2004/0000968 A1 * 1/2004 White ................. H01L 25/0652 333/204
2006/0145782 A1 * 7/2006 Liu ........................ H03H 7/463 333/132
2006/0220765 A1 * 10/2006 Muller .................. H01P 1/2053 333/206
2009/0058563 A1 * 3/2009 Seo ....................... H01P 1/2053 333/209
2010/0277259 A1 * 11/2010 Ahn ..................... H03H 7/1775 333/204
2011/0241801 A1 10/2011 Subedi
2013/0093539 A1 4/2013 Hedemaki et al.
2014/0340169 A1 11/2014 Subedi
2016/0365616 A1 * 12/2016 Baldwin ............. H01P 1/20336
2017/0263992 A1 * 9/2017 Nita ........................ H01P 1/205
2019/0280358 A1 9/2019 Zhang et al.
2019/0348735 A1 * 11/2019 Wang .................. H01P 1/20336
2020/0373644 A1 * 11/2020 Goulouev ............... H01P 1/208
2021/0257707 A1 * 8/2021 Meng .................... H01P 1/2002
2022/0158317 A1 * 5/2022 Kufa .......................... H01P 7/10
2022/0352612 A1 * 11/2022 Meng ...................... H01P 7/105
2023/0412137 A1 * 12/2023 Ogawa ................. H03H 7/0115
2024/0162877 A1 * 5/2024 Takami ................... H01P 1/203
2025/0132480 A1 * 4/2025 Fu ......................... H01P 1/2053

FOREIGN PATENT DOCUMENTS

JP 63-278402 A 11/1988
JP 2008-205558 A 9/2008
JP 2018-535617 A 11/2018
KR 20130034990 A * 4/2013 .............. H01P 1/207
WO 2018/092453 A1 5/2018
WO 2020200318 A1 10/2020

OTHER PUBLICATIONS

George L. Matthaei et al., “Microwave Filters, Impedance-Matching Networks, and Coupling Structures,” 1980, pp. 920-923 pages, Artech House, Inc.
Intention to Grant, EP App. No. 22720082.1, Apr. 23, 2025, 33 pages.
Office Action, JP App. No. 2024-516350, Apr. 1, 2025, 06 pages (03 pages of English Translation and 3 pages of Original Document).
Decision to Grant, EP App. No. 22720082.1, Aug. 28, 2025, 2 pages.
Office Action, JP App. No. 2024-516350, Aug. 5, 2025, 06 pages (03 pages of English Translation and 03 pages of Original Document).

* cited by examiner

INTEGRATED LOW-PASS AND BAND-PASS FILTER UNIT FORMED BY SHEET METAL COATED WITH DIELECTRIC MATERIAL

CROSS-REFERENCE TO RELATED APPLICATIONS

This application is a National stage of International Application No. PCT/SE2022/050401, filed Apr. 26, 2022, which claims priority to International Application No. PCT/CN2021/118317, filed Sep. 14, 2021, which are hereby incorporated by reference.

TECHNICAL FIELD

Embodiments herein relate to filters. In particular, they relate to integrated low-pass and band-pass filter unit formed by sheet metal coated with dielectric material.

BACKGROUND

In the 5th Generation (5G) communication, two types of frequency ranges have been defined, Frequency Range-1, i.e. Sub-6 GHZ, which is less than 6 GHZ, and Frequency Range-2, i.e. millimeter wave, which is above 24 GHz. With the development of the 5G communication, multiple-input and multiple-output (MIMO) technology is widely used in Sub-6 GHz base station product, in which amount of filter unites (FUs) need to be integrated with antenna unit (AU) or radio unit (RU). Considering cost and space saving, FUs are usually soldered onto radio unit mother board, Low-Pass Filter (LPF) board or antenna power splitter board, which means smaller and lighter FUs are quite in demand.

In traditional base station solutions, metal cavity FUs are most recommended because of their high Quality (Q) value and power handling performance. For 5G advanced radio system, the size and weight of FUs become critical issues. Ceramic waveguide (CWG) filters especially CWGs are one of the preferred FU solutions for 5G, due to their high performance, light weight, small size and easy integration. However, there are so many limitations of CWG FU, e.g., the Q value of a CWG filter is lower than a metal cavity filter, the size of a CWG filter needs to be limited to reduce the risk of being cracked when it is soldered onto a board since the ceramic material is easy to break if the size is too big, the high frequency suppression, i.e. the out of band frequency attenuation performance is relatively poor, etc. Due to those limitations, radio products which can use CWG filters are limited.

SUMMARY

As a part of developing embodiments herein, problems and limitations with traditional CWG filters and metal FUs will further be discussed.

Traditional metal FUs have good performance and reliability. However, they have big size or volume and higher cost and are not a good solution for MIMO system.

One of the problems of the current CWG filters is bandwidth limitation. While a wideband radio product demands for wideband filters.

The Q value of a CWG filter is lower. To increase the Q value, the size of the cavity must be increased, and this contradicts with the basic design desire of smaller size.

CWG FUs also have limitation factors in production, which cannot be used in complex radio systems. They are also unreliable during long-term radio work progress. A CWG FU is always soldered with a Printed Circuit Board (PCB) LPF to get better out of band attenuation, the LPF will bring much loss and extra coupling from two near paths on the PCB.

Sheet metal FUs have good reliability in production, but they have worser power handling capacity and bigger size compared to CWG FUs. Sheet metal band pass filter (BPF) is usually combined with a sheet metal LPF to get better out of band attenuation, the sheet metal LPF has smaller insertion loss compared with the PCB LPF.

It is therefore an object of embodiments herein to provide a filter unit with improved radio performance, power handling capacity and reliability, and at the same time with reduced size and weight.

According to one aspect, the object is achieved by an integrated low-pass and band-pass filter unit. The integrated low-pass and band-pass filter unit comprises an inner cavity formed by a shell of conductive materials. The integrated low-pass and band-pass filter unit further comprises one or more low-pass resonators and two or more band-pass resonators comprised in the inner cavity. The low-pass and band-pass resonators are integrally formed by electroplated sheet metal material. A part of each of the low-pass and band-pass resonators is coated with dielectric material. The two or more band-pass resonators are arranged at two sides of the inner cavity such that at least two resonators are aligned to face each other.

The integrated low-pass and band-pass filter unit further comprises a first separator of electroplated sheet metal arranged in the inner cavity between the low-pass resonators and band-pass resonators and a second separator of electroplated sheet metal arranged in the inner cavity between the band-pass resonators at the two sides of the inner cavity.

The integrated low-pass and band-pass filter unit further comprises an input port to receive a signal to be filtered and an output port to output a filtered signal.

According to some embodiments herein, the integrated low-pass and band-pass filter unit may further comprise a first coupling structure of the dielectric material. The first coupling structure is arranged between the two resonators facing each other and the first coupling structure may be connected to the dielectric material coated part of the one resonator or to the dielectric material coated parts of both resonators.

In other words, according to the embodiments herein, to solve the contradiction between the high Q-factor and small size of a filter, an integrated low-pass and band-pass filter unit formed by sheet metal coated with dielectric material is provided.

The integrated low-pass and band-pass filter unit according to embodiments herein have some advantages, for examples:

- The volume is smaller and lighter compare with the traditional metal filters. Using the dielectric material, e.g. plastic, coated sheet metal resonators can effectively reduce the resonance frequency of the resonator in order to reduce the size of the resonator. In turn, the size of the cavity containing the resonator is reduced, and as the result, the size of the whole filter is reduced.
- The dielectric material's dielectric constant is higher than air, a part of the electric field of the resonator is constraint in the dielectric coated boundary, therefore, the maximum field intensity of a single cavity is relatively lower, which can significantly improve the power handling capacity of the integrated low-pass and band-pass filter unit.

- The integrated low-pass and band-pass filter unit may be moulded by pressing and bending in the production process, and then plastic injection moulding is used to cover the resonators. This production process improves the tolerance level of the resonators and the consistency of the RF performance compared to the traditional process with soldering or screwing tightly to form metal filter units.
- Both negative and positive coupling structures may be introduced in the integrated low-pass and band-pass filter unit. The upper half of the two plastic coated resonators facing each other may be filled with plastic to form strong negative coupling. The negative coupling may be adjusted freely by adjusting the size of the connecting plastic or by loading screws. Therefore, the proposed coupling structures make the cross-coupling easier to be controlled. Negative coupling and positive coupling can be more flexible established, routed and placed.
- The design of the integrated low-pass and band-pass filter unit can be flexible according to different specifications of radio performance. The number of resonators of low-pass and band-pass may be adjusted according to radio performance requirement.
- The integrated low-pass and band-pass filter unit is more flexible in design for macro base station and may be used for indoor small base station and traditional macro base station and has advantage in production and cost.
- The low-pass filter is integrated on the sheet metal with the band-pass filter and can provide a strong suppression for radio frequency signals in 8 GHZ-18 GHz.

Therefore, embodiments herein provide a filter unit with improved radio performance, power handling capacity and reliability, and at the same time with reduced size and weight.

BRIEF DESCRIPTION OF THE DRAWINGS

Examples of embodiments herein are described in more detail with reference to attached drawings in which.

DETAILED DESCRIPTION

According to embodiments herein, to solve the contradiction between the Q-factor and size of a filter, an integrated low-pass and band-pass filter unit with low-pass and band-pass function formed by sheet metal materials and parts of the sheet metal materials being dielectric material-coated is provided.

The integrated low-pass and band-pass filter unit according to the embodiments herein comprises a main body comprising a low-pass filter comprising one or more low-pass resonators and a band-pass filter comprising two or more band-pass resonators. The low-pass and band-pass resonators are integrally formed by electroplated sheet metal material. To reduce the size of the main body, parts of the metal sheet resonators can be coated with dielectric material.

Figure 1A:
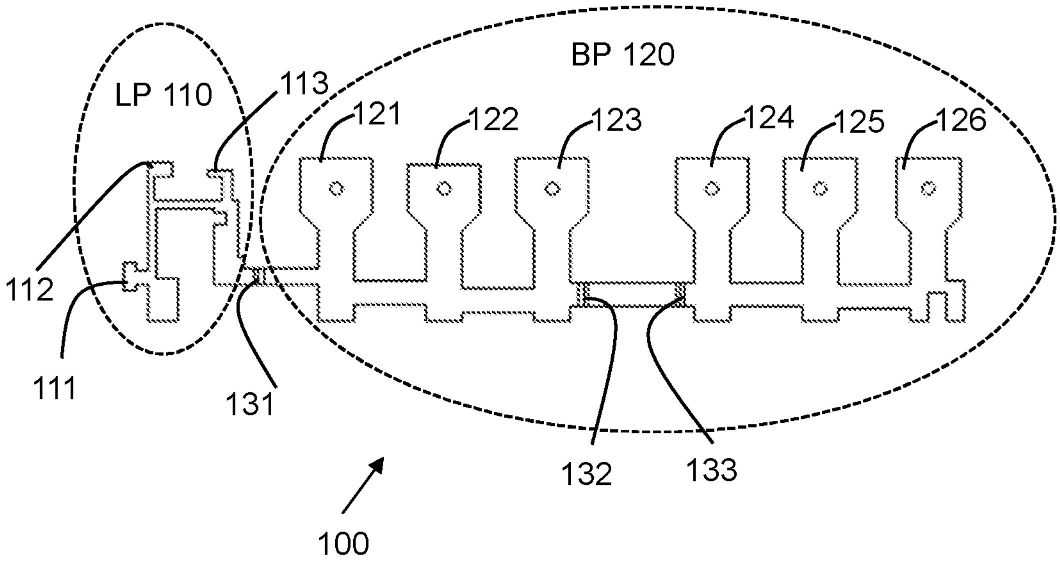
FIG. 1*a* shows an example of a flat expansion of the metal sheet of a low-pass filter and band-pass filter according to embodiments herein.

FIG. 1*a* shows a flat expansion of a low-pass (LP) filter LP 110 and band-pass (BP) filter BP 120 integrally formed by a sheet of metal material 100. The sheet metal material may be electroplated sheet metal. The low-pass and band-pass filters LP 110, BP 120 may be formed by sheet metal wire cutting, molding or stamping processing.

Figure 1B:
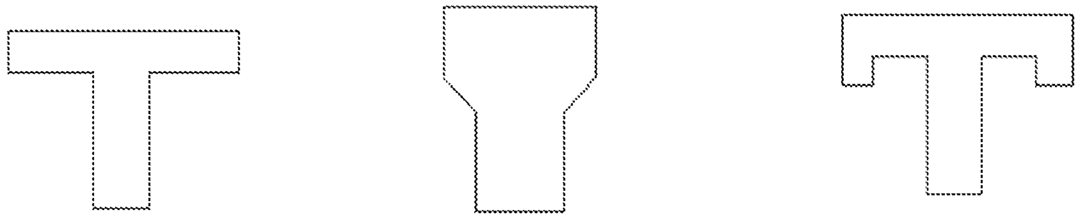
FIG. 1*b* shows some example shapes of resonators according to embodiments herein.

FIG. 1 is only for illustrating purpose and shows example structures of the low-pass and band-pass filters LP 110, BP 120 integrally formed by a sheet of metal. It is shown in FIG. 1, the low-pass filter LP 110 comprises 3 LP resonators 111, 112, 113 and the band-pass filter BP 120 comprises 6 BP resonators 121, 122, 123, 124, 125, 126. However, the number and shape of the low-pass and band-pass resonators may vary depending on different application scenarios. The number of resonators is related to the performance of the filter. The more the number of filter resonators, the better the out-of-band suppression, but the worse the insertion loss. FIG. 1*b* shows some example shapes of resonators.

The flat metal sheet of the low-pass and band-pass filters LP 110, BP 120 is bent to form the main body of the integrated low-pass and band-pass filter unit. For example, the flat metal sheet of the low-pass and band-pass resonators 111, 112, 113, 121, 122, 123, 124, 125, 126 may be bent at the positions 131, 132, 133 shown in FIG. 1 by bending processing in production.

Figure 2:
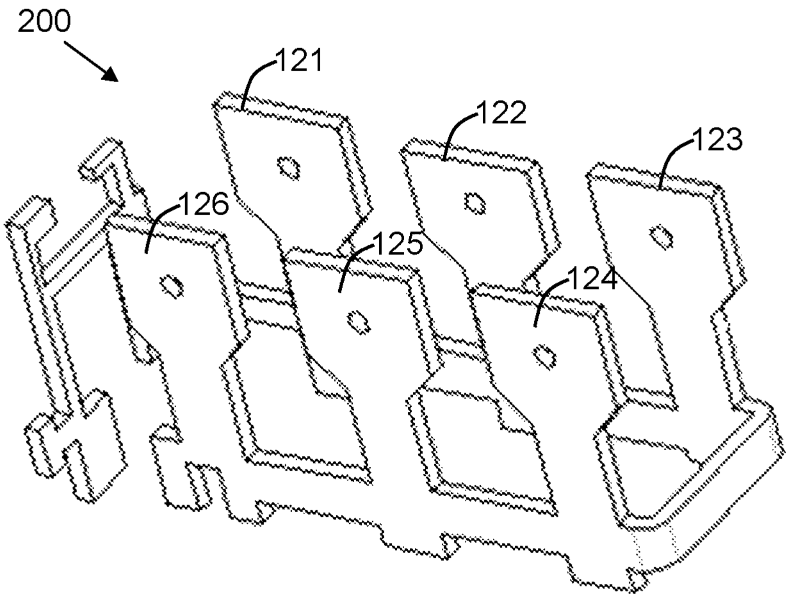
FIG. 2 shows a view of an example main body of an integrated low-pass and band-pass filter unit according to embodiments herein.

FIG. 2 shows the main body 200 of the integrated low-pass and band-pass filter unit after the bending process is performed on the flat metal sheet of the low-pass and band-pass resonators 111, 112, 113, 121, 122, 123, 124, 125, 126 shown in FIG. 1. In this example, the band-pass resonators 121, 122, 123, 124, 125, 126 have been formed to a symmetrical structure after the bending processing performed at the bending positions 132, 133 shown in FIG. 1. The six band-pass resonators 121, 122, 123, 124, 125, 126 have been arranged and aligned at two sides, and each side comprises 3 resonators. As can be seen from FIG. 2, there are 3 pairs of aligned resonators facing to each other. For example, the BP resonators 121 and 126 is a pair of aligned resonators facing each other, the BP resonators 122 and 125 is a pair of aligned resonators facing each other, and the BP resonators 123 and 124 is a pair of aligned resonators facing each other.

The bending positions may be chosen at other places than what are shown in FIG. 1 according to different application scenarios. Then, the band-pass resonators 121, 122, 123, 124, 125, 126 may be formed to a non-symmetrical structure, for example, one side comprises 2 resonators, and the other side comprises 4 resonators, and there are two pairs of aligned resonators facing each other. The bending positions may be chosen freely.

Figure 3:
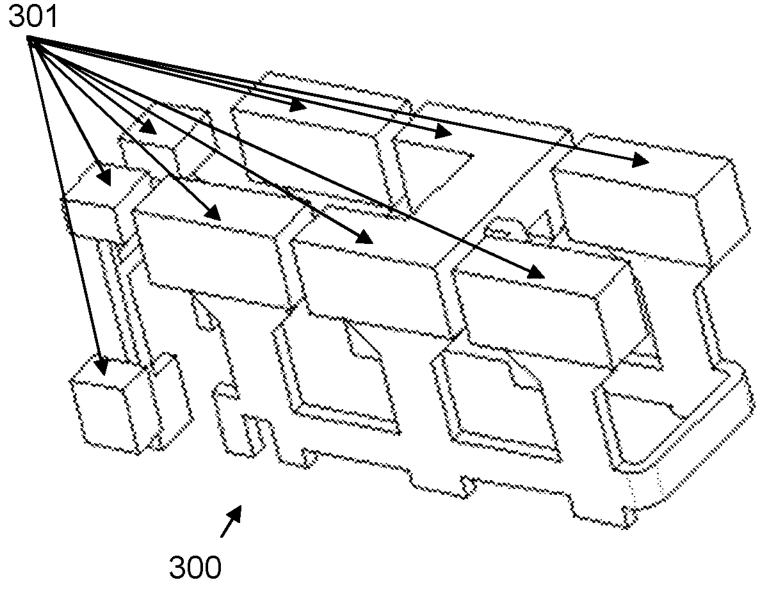
FIG. 3 shows a view of an example main body of the integrated low-pass and band-pass filter unit where parts of the resonators are coated with dielectric material according to embodiments herein.

FIG. 3 shows the main body 300 of the integrated low-pass and band-pass filter unit where a part of each of the low-pass and band-pass resonators is coated with dielectric material, indicated by 301. The dielectric material may be plastic, other polymer materials or ceramic.

For the same Q value, the lower the frequency, the larger the volume of a single cavity of a resonator. The resonant frequency of a resonator is the frequency at which the energy of the stored electric field equals that of the stored magnetic field. The plastic-coated high dielectric material makes the electric field energy and magnetic field energy mostly concentrated near the resonator and equal to the electromagnetic field energy at lower frequencies. Therefore using the dielectric material coated sheet metal resonators can effectively reduce the resonance frequency of the resonator in order to reduce the size of the resonator. As a result, the size of a single cavity of a resonator and in turn, the size of the whole filter unit composed of several single cavities can be reduced.

Since the dielectric constant of the dielectric material, e.g., plastic, is higher than air, a part of the electric field generated by a resonator is constraint within the plastic boundary. Therefore, the maximum electric field intensity of a single cavity containing the resonators is relatively lower, which can significantly improve the power handling capacity of the filter unit.

Materials with the dielectric constant of 1.8~10 are preferred. In actual use, materials with Dielectric Loss Angle lower than one thousandth are preferred based on the insertion loss characteristics of the filter. Dielectric Loss Angle is the phase difference between the electric field vector and the electric displacement in a dielectric material. This phase difference is caused by energy losses in the dielectric.

Figure 4A:
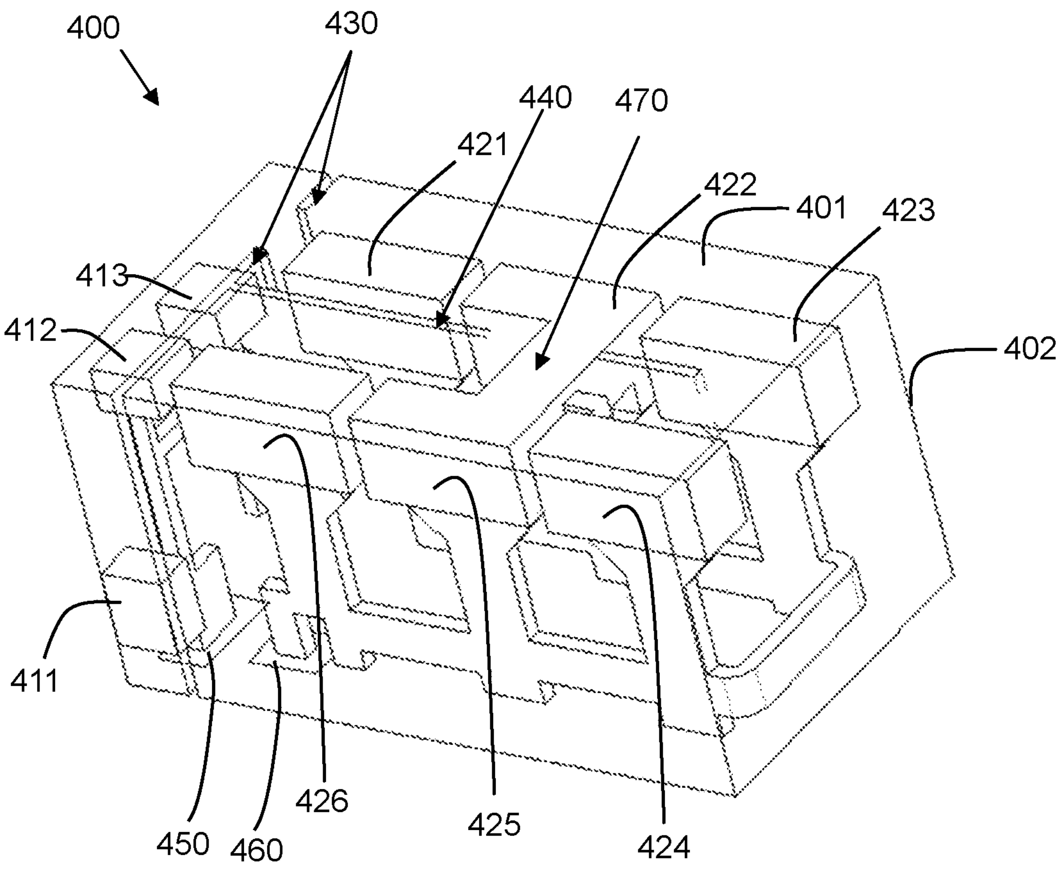
FIG. 4*a* shows a view of an example structure of an integrated low-pass and band-pass filter unit according to embodiments herein.

The main body 300 is placed in a shell to form a complete filter. FIG. 4*a* shows an example structure of a complete integrated low-pass and band-pass filter unit 400 according to the embodiments herein. The main body 300, i.e., the dielectric material coated low-pass and band-pass resonators, is contained in an inner cavity 401 formed by a shell 402 of conductive materials. The shell 402 can be made up of any combination of profile, bending sheet metal and flat sheet metal.

The integrated low-pass and band-pass filter unit 400 according to the embodiments herein comprises the inner cavity 401, one or more low-pass resonators 411, 412, 413 and two or more band-pass resonators 421, 422, . . . 426 comprised in the inner cavity 401. The low-pass and band-pass resonators 411, 412, 413, 421, . . . 426 are integrally formed by electroplated sheet metal material. A part of each of the low-pass and band-pass resonators 411, 412, 413, 421, . . . 426 is coated with dielectric material.

The two or more band-pass resonators 421, . . . 426 are arranged at two sides of the inner cavity 401 such that at least two resonators, e.g. band-pass resonators 422, 425, are aligned to face each other.

The integrated low-pass and band-pass filter unit 400 further comprises a first separator 430 of electroplated sheet metal arranged in the inner cavity 401 between the low-pass resonators 411, 412, 413 and band-pass resonators 421, . . . 426 to separate the spatial between the low-pass resonators 411, 412, 413 and band-pass resonators 421, . . . 426.

The integrated low-pass and band-pass filter unit 400 further comprises a second separator 440 of electroplated sheet metal arranged in the inner cavity 401 between the band-pass resonators at the two sides of the cavity 401 to separate the spatial between the two sides of the band-pass resonators.

The integrated low-pass and band-pass filter unit 400 further comprises an input port 450 to receive a signal to be filtered and an output port 460 to output a filtered signal.

According to embodiments herein, a negative coupling structure may be introduced in the integrated low-pass and band-pass filter unit 400. For example, the upper half of the two plastic-coated resonators facing each other may be filled with plastic to form strong negative coupling.

Therefore, according to some embodiments herein, the integrated low-pass and band-pass filter unit 400 may further comprise a first coupling structure 470 of the dielectric material. The first coupling structure 470 may be arranged between two BP resonators facing each other, e.g. between the BP resonators 422 and 425. The first coupling structure 470 may be connected to the dielectric material coated parts of both resonators, as shown in FIG. 4*a*.

Figure 4B:
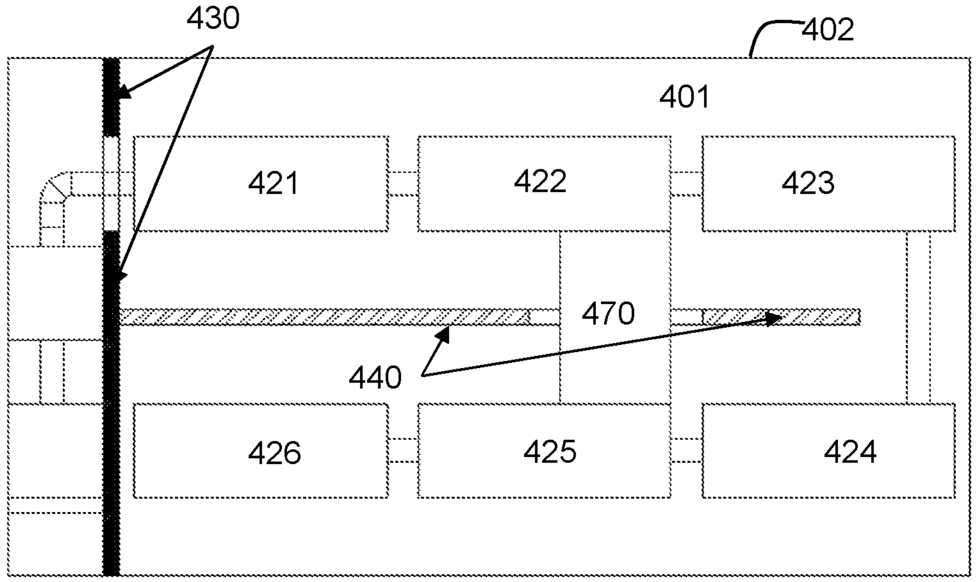
FIG. 4*b* is a top view of the integrated low-pass and band-pass filter unit shown in FIG. 4.

FIG. 4*b* is a schematic top view of the integrated low-pass and band-pass filter unit 400 to give a clearer view of the first and second separators 430, 440 and the negative coupling structure 470.

Figure 4C:
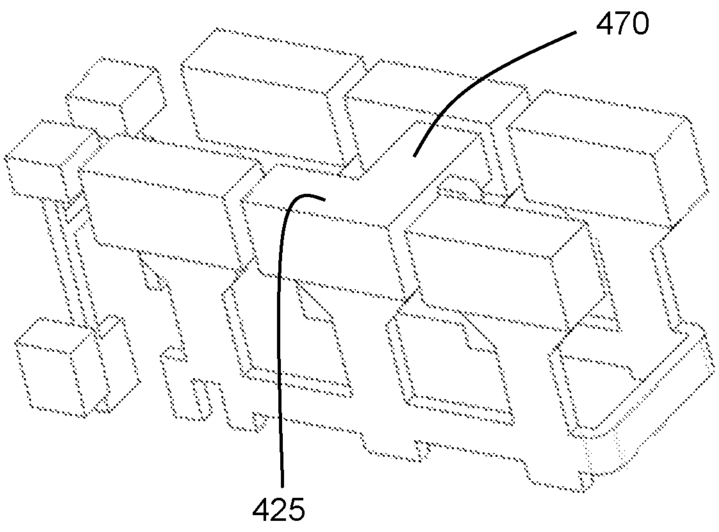
FIG. 4*c* shows another view of an example structure of an integrated low-pass and band-pass filter unit according to embodiments herein.

The first coupling structure 470 may also be connected only to the dielectric material coated part of one of the two facing BP resonators, e.g. the first coupling structure 470 is only connected to the BP resonator 425, as shown in FIG. 4*c*.

Figure 4D:
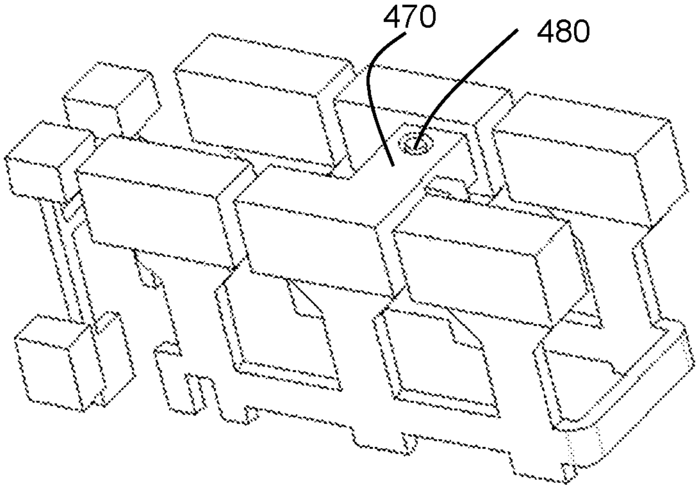
FIG. 4*d* shows a view of an example loading screw placed in the integrated low-pass and band-pass filter unit shown in FIG. 4*c* according to embodiments herein.
Figure 4E:
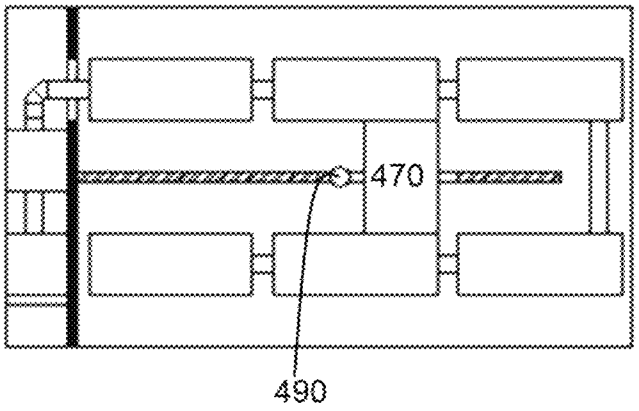
FIG. 4*e* shows a view of another example loading screw placed in the integrated low-pass and band-pass filter unit shown in FIG. 4*a* according to embodiments herein.

The negative coupling occurs at the top of the resonators. Therefore, the first coupling structure 470 is a negative coupling structure. The negative coupling changes with the size and shape of the coupling structure 470. Thus, the negative coupling may be adjusted freely by adjusting the size and/or the shape of the coupling structure 470. The negative coupling may also be adjusted by a loading screw 480 placed at the middle of the coupling structure 470 as shown in FIG. 4*d* or a loading screw 490 placed at the side of the coupling structure 470 as shown in FIG. 4*e*.

The first coupling structure 470 of the dielectric material is placed at the top of the two resonators facing each other such that a negative coupling between the two resonators is achieved as a result of directions of the electric fields generated by the two resonators being opposite.

Figure 5A:
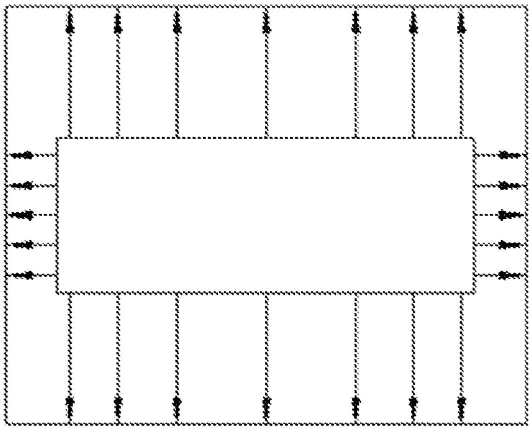
FIG. 5*a* is a simplified top view of the distribution of electric field in a single cavity of a metal resonator.
Figure 5B:
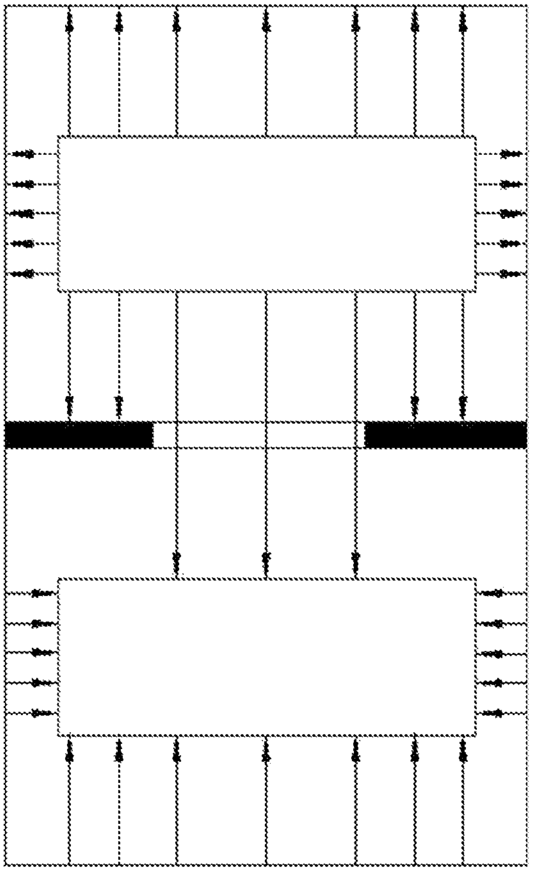
FIG. 5*b* is a simplified top view of the distribution of negative coupling electric field between two sheet metal resonators.

FIG. 5*a* is a simplified top view of the distribution of electric field in a single cavity of a single sheet metal resonator. The arrows represent the direction of electric field generated by the resonator. Generally, when there is negative coupling between two sheet metal resonators, the direction of electric field in a single cavity of one sheet metal resonator must be opposite to that in another single cavity of another sheet metal resonator. FIG. 5*b* is a simplified top view of the typical distribution of negative coupling electric field between two sheet metal resonators. As it can be seen, the directions of the electric fields generated by the two resonators are opposite.

Figure 5C:
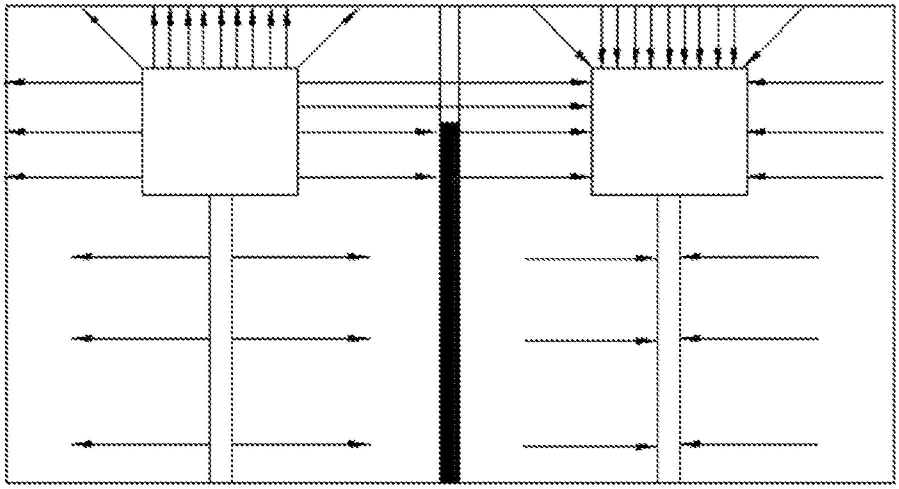
FIG. 5*c* is a simplified side view of the distribution of electric fields between two sheet metal resonators with the coupling window at the top of the resonators.

FIG. 5*c* is a simplified side view of the distribution of electric fields between two sheet metal resonators. The coupling window is at the top of the resonators. After the coupling of the two resonators, the directions of the electric fields of the two resonators are completely opposite. This coupling is called negative coupling.

Figure 5D:
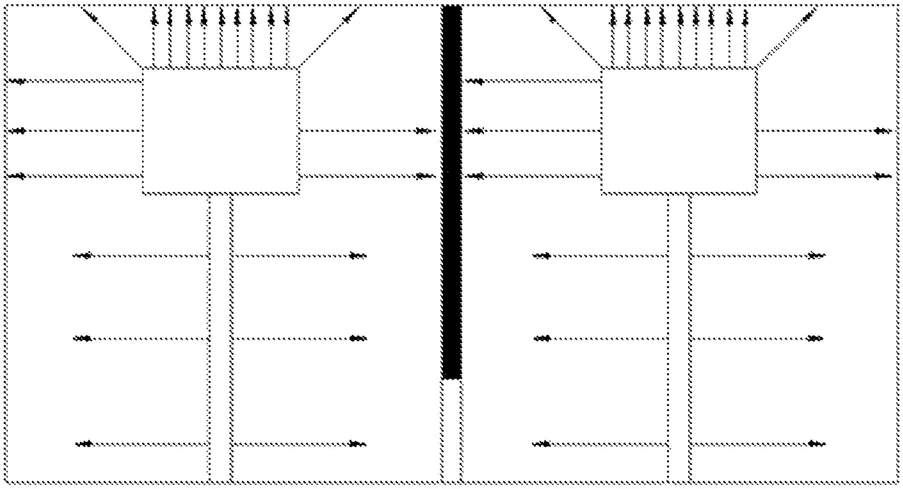
FIG. 5*d* is a simplified side view of the distribution of electric fields between two sheet metal resonators with the coupling window at the bottom of the resonators.

FIG. 5*d* is a simplified side view of the distribution of electric fields between two sheet metal resonators. The coupling window is at the bottom of the resonators. After the coupling of the two resonators, the electric field directions of the two resonators are the same. This coupling is called positive coupling.

Figure 6:
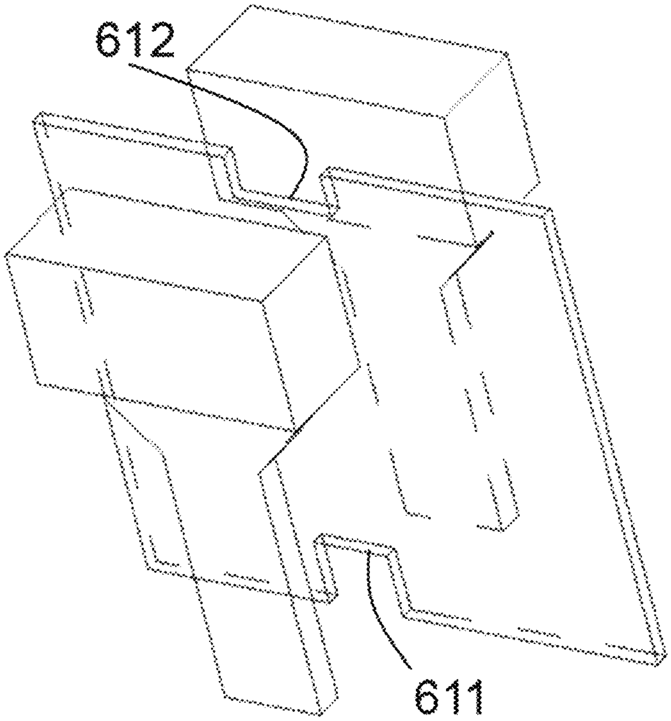
FIG. 6 shows one example structure of two resonators facing each other with positive and negative couplings according to embodiments herein.

When positive coupling occurs between two resonators, the direction of electric field in one single cavity of one resonator will generally be the same as that in another single cavity of another resonator. When the plastic-coated position is at the bottom of the two resonators, the coupling of the resonators will produce positive coupling, and the coupling strength varies with the change of the coupling window. FIG. 6 shows an example structure of a positive coupling window 611 placed at the bottom of the resonators and a negative coupling window 612 placed at the top of the resonators.

Therefore, according to some embodiments herein, the integrated low-pass and band-pass filter unit 400 may further comprise a second coupling structure 611. The second coupling structure 611 may be placed at the bottom of two resonators such that a positive coupling between the two resonators is achieved as a result of directions of electric fields generated by the two resonators being the same.

The positive coupling may be achieved by a coupling structure between two resonators facing each other or any two neighbor resonators at the same side of the inner cavity 401. Generally, between the bottom and upper of a resonator, For examples, an open window structure 611, a coupling structure of dielectric material, a direct metal bar connection etc. all are positively couplings.

Figure 7:
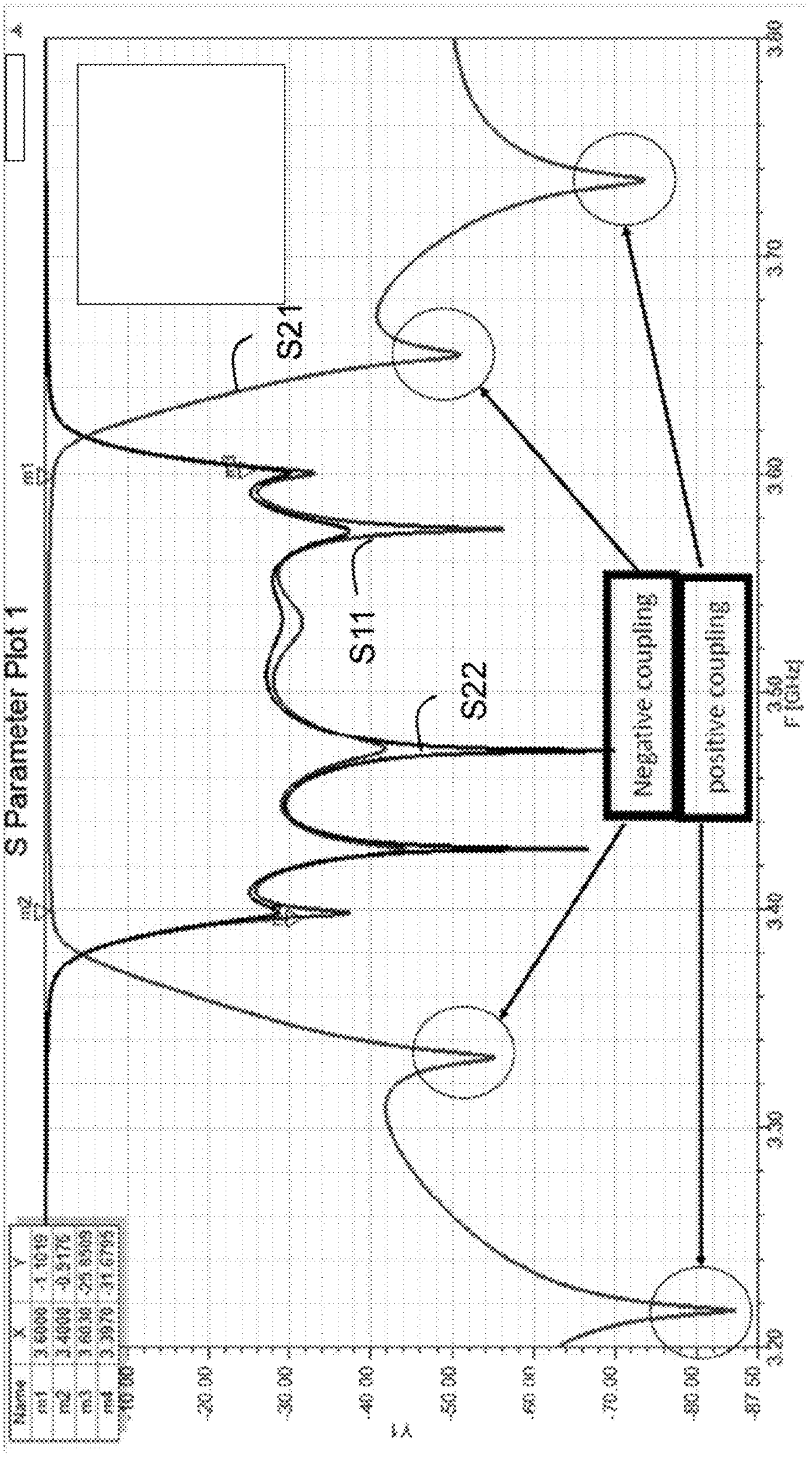
FIG. 7 shows S-parameter simulation results for the integrated low-pass and band-pass filter unit according to embodiments herein.

FIG. 7 is diagram showing simulation results of S-parameter, input-to-input S11, output-to-input S21, and output-to-output S22 curves for a typical use case of the integrated low-pass and band-pass filter unit 400. It can be seen from the structure of the integrated low-pass and band-pass filter unit 400 that the filter produces negative coupling between the second and fifth resonators resulting two first-order zeros and positive coupling in the first and sixth resonators resulting two second-order zeros for the band-pass filter.

Figure 8:
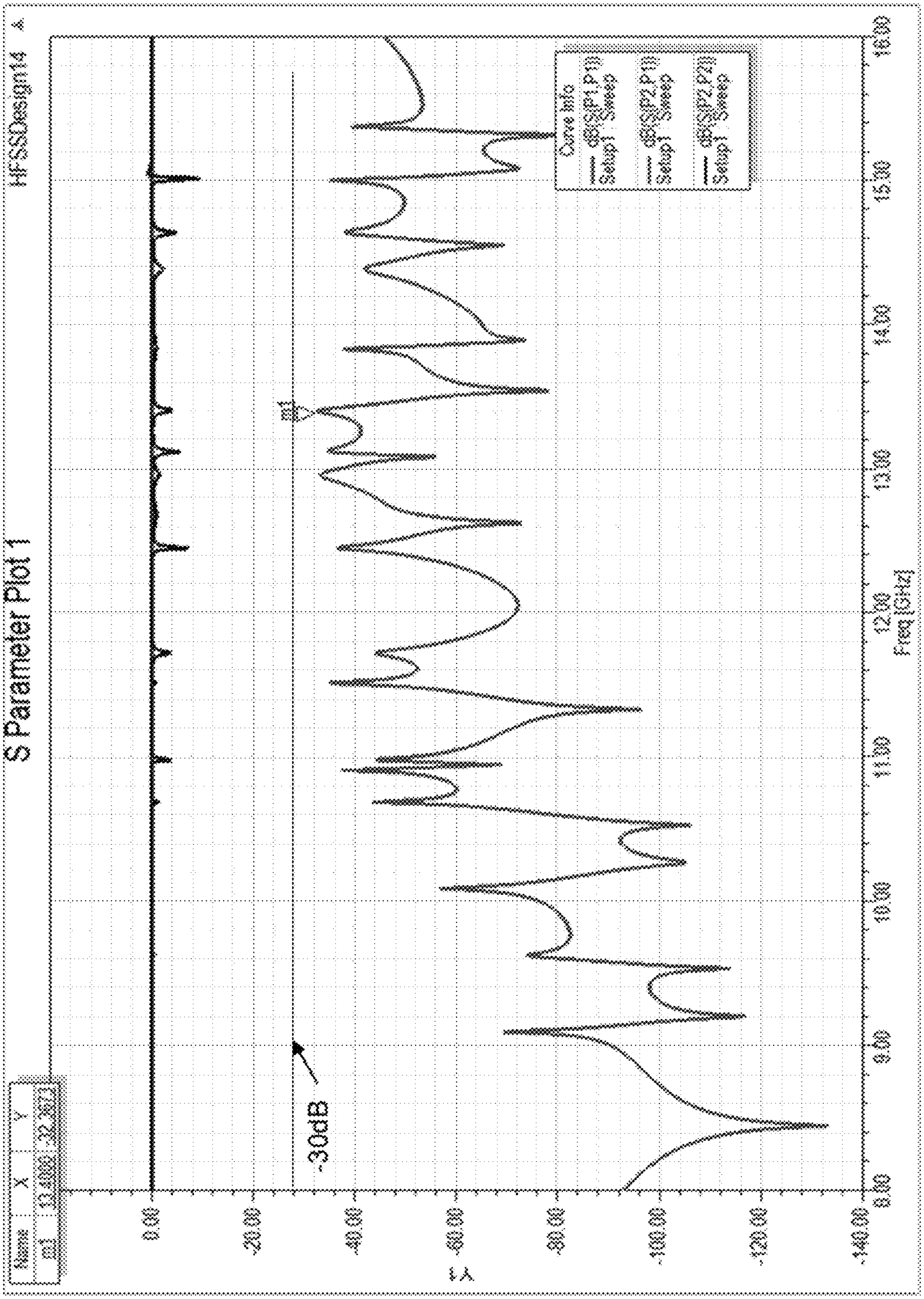
FIG. 8 shows simulation results of out-of-band high frequency suppression performance for the integrated low-pass and band-pass filter unit according to embodiments herein.

FIG. 8 is diagram showing out-of-band suppression performance at high frequencies of the integrated low-pass and band-pass filter unit 400, which is over −30 dB in the high frequency region of 8 Ghz-16 Ghz.

Figure 9:
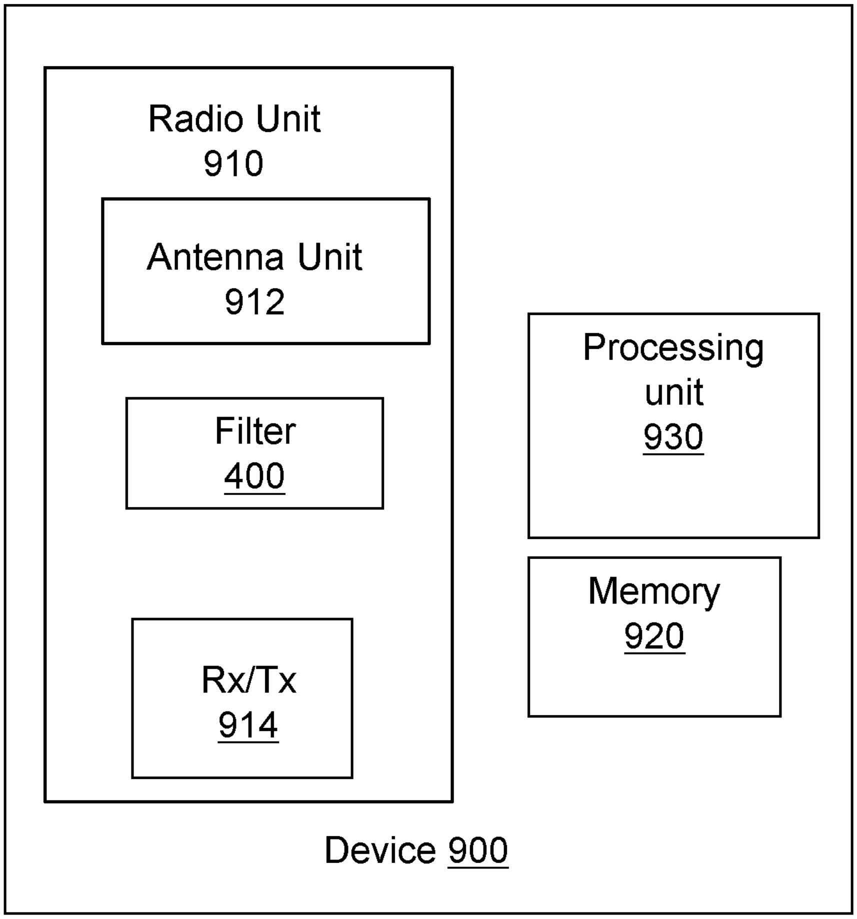
FIG. 9 is a block diagram illustrating a device in which the integrated low-pass and band-pass filter unit according to embodiments herein may be implemented.

The integrated low-pass and band-pass filter unit 400 according to the embodiments herein may be employed in various electronic devices or any devices or apparatus where filtering radio frequency signals is needed. FIG. 9 shows a block diagram for a device 900. The device 900 may comprise a radio unit 910, which may comprise an antenna unit 912, a transmitter, a receiver or both, i.e. a transceiver Rx/Tx 9140 etc. The device 900 comprises the integrated low-pass and band-pass filter unit 400. The integrated low-pass and band-pass filter unit 400 may be comprised in the radio unit 910, in the antenna unit 912, or in the transceiver Rx/Tx 914. The device 900 may comprise other units, where a memory 920, a processing unit 930 are shown. The device 900 may be a radio base station or micro base station for a cellular communication system or any device where a filter is needed for filtering radio frequency signals.

One or more integrated low-pass and band-pass filter units 400 may also form a multiband filter unit and employed in various electronic devices or any devices or apparatus where filtering radio frequency signals is needed.

To summarize, according to the embodiments herein, an integrated low-pass and band-pass filter unit 400 formed by sheet metal coated with dielectric material is provided and has some advantages, for examples:

- Reduced size and weight for radio unit using the integrated low-pass and band-pass filter unit 400. The volume is smaller and lighter compare with the traditional metal filters. Using the dielectric material, e.g. plastic, coated sheet metal resonators can effectively reduce the resonance frequency of the resonator in order to reduce the size of the resonator. In turn, the size of the cavity containing the resonator is reduced, and as the result, the size of the whole filter is reduced.
- Solving the design contradiction between the Q value and size of a filter.
- Getting better reliability while reducing the size of the filter.
- Realizing complex multiband FUs.
- Getting better power handling capacity with small size or volume. The dielectric material's dielectric constant is higher than air, a part of the electric field of the resonator is constraint in the dielectric coated boundary, therefore, the maximum field intensity of a single cavity is relatively lower, which can significantly improve the power handling capacity of the integrated low-pass and band-pass filter unit.
- Realizing better out of band attenuation and getting better insertion loss compared with PCB LPF. The low-pass filter is integrated on the sheet metal with the band-pass filter and can provide a strong suppression for radio frequency signals in 8 GHZ-18 GHz. Easy to get wide bandwidth and better harmonic attenuation.
- Providing flexible assembling solution for filters, as well as high level building practice solutions, e.g. the integrated low-pass and band-pass filter unit 400 may be soldered on PCB, or use screw fasten solution by the metal part when connecting with other function units.
- The integrated low-pass and band-pass filter unit may be moulded by pressing and bending in the production process, and then plastic injection moulding may be used to cover the resonators. This production process improves the tolerance level of the resonators and the consistency of the RF performance compared to the traditional process with soldering or screwing tightly to form metal filter units.
- Both negative and positive coupling structures may be introduced in the integrated low-pass and band-pass filter unit. The upper half of the two plastic coated resonators facing each other may be filled with plastic to form strong negative coupling. The negative coupling may be adjusted freely by adjusting the size of the connecting plastic or by loading screws. Therefore, the proposed coupling structures make the cross-coupling easier to be controlled. Negative coupling and positive coupling can be more flexible established, routed and placed.

The design of the integrated low-pass and band-pass filter unit can be flexible according to different specifications of radio performance. The number of resonators of low-pass and band-pass may be adjusted according to radio performance requirement.

Good performance with appropriate cost. The integrated low-pass and band-pass filter unit is more flexible in design for macro base station and may be used for indoor small base station and traditional macro base station and has advantage in production and cost.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. An integrated low-pass and band-pass filter unit comprising:

an inner cavity formed by a shell of conductive materials;

one or more low-pass resonators and two or more band-pass resonators comprised in the inner cavity, wherein the low-pass and band-pass resonators are integrally formed by electroplated sheet metal material, and a part of each of the low-pass and band-pass resonators is coated with dielectric material, and wherein the two or more band-pass resonators are arranged at two sides of the inner cavity such that at least two resonators are aligned to face each other;

a first separator of electroplated sheet metal arranged in the inner cavity between the low-pass resonators and band-pass resonators;

a second separator of electroplated sheet metal arranged in the inner cavity between the band-pass resonators at the two sides of the inner cavity;

an input port to receive a signal to be filtered; and an output port to output a filtered signal.

2. The integrated low-pass and band-pass filter unit-according to claim 1, wherein the dielectric material is plastic, other polymer materials, or ceramic.

3. The integrated low-pass and band-pass filter unit-according to claim 1, wherein the integrated low-pass and band-pass filter unit further comprises a first coupling structure of the dielectric material, and wherein the first coupling structure is arranged between the two resonators facing each other, the first coupling structure is connected to the dielectric material coated part of the one resonator or to the dielectric material coated parts of both resonators.

4. The integrated low-pass and band-pass filter unit according to claim 3, wherein the first coupling structure of the dielectric material is placed at a top of the two resonators facing each other, such that a negative coupling between the two resonators is achieved as a result of directions of electric fields generated by the two resonators being opposite.

5. The integrated low-pass and band-pass filter unit according to claim 4, wherein the integrated low-pass and band-pass filter unit further comprises a second coupling structure, wherein the second coupling structure is placed at a bottom of two resonators such that a positive coupling between the two resonators is achieved as a result of directions of electric fields generated by the two resonators being the same.

6. The integrated low-pass and band-pass filter unit according to claim 2, wherein the integrated low-pass and band-pass filter unit further comprises a first coupling structure of the dielectric material, and wherein the first coupling structure is arranged between the two resonators facing each other, the first coupling structure is connected to the dielectric material coated part of the one resonator or to the dielectric material coated parts of both resonators.

7. An antenna unit comprising:

one or more integrated low-pass and band-pass filter units, wherein each of the one or more integrated low-pass and band-pass filter units comprises:

an inner cavity formed by a shell of conductive materials;

one or more low-pass resonators and two or more band-pass resonators comprised in the inner cavity, wherein the low-pass and band-pass resonators are integrally formed by electroplated sheet metal material, and a part of each of the low-pass and band-pass resonators is coated with dielectric material, and wherein the two or more band-pass resonators are arranged at two sides of the inner cavity such that at least two resonators are aligned to face each other;

a first separator of electroplated sheet metal arranged in the inner cavity between the low-pass resonators and band-pass resonators;

a second separator of electroplated sheet metal arranged in the inner cavity between the band-pass resonators at the two sides of the inner cavity;

an input port to receive a signal to be filtered; and an output port to output a filtered signal.

8. The antenna unit according to claim 7, wherein for each of the one or more integrated low-pass and band-pass filter units, the dielectric material is plastic, other polymer materials, or ceramic.

9. The antenna unit according to claim 7, wherein for each of the one or more integrated low-pass and band-pass filter units further comprises a first coupling structure of the dielectric material, and wherein the first coupling structure is arranged between the two resonators facing each other, the first coupling structure is connected to the dielectric material coated part of the one resonator or to the dielectric material coated parts of both resonators.

10. The antenna unit according to claim 9, wherein for each of the one or more integrated low-pass and band-pass filter units, the first coupling structure of the dielectric material is placed at a top of the two resonators facing each other, such that a negative coupling between the two resonators is achieved as a result of directions of electric fields generated by the two resonators being opposite.

11. The antenna unit according to claim 10, wherein for each of the one or more integrated low-pass and band-pass filter units, the integrated low-pass and band-pass filter unit further comprises a second coupling structure, wherein the second coupling structure is placed at a bottom of two resonators such that a positive coupling between the two resonators is achieved as a result of directions of electric fields generated by the two resonators being the same.

12. The antenna unit according to claim 8, wherein for each of the one or more integrated low-pass and band-pass filter units further comprises a first coupling structure of the dielectric material, and wherein the first coupling structure is arranged between the two resonators facing each other, the first coupling structure is connected to the dielectric material coated part of the one resonator or to the dielectric material coated parts of both resonators.

13. A radio unit comprising:

one or more integrated low-pass and band-pass filter units, wherein each of the one or more integrated low-pass and band-pass filter units comprises:

an inner cavity formed by a shell of conductive materials;

one or more low-pass resonators and two or more band-pass resonators comprised in the inner cavity, wherein the low-pass and band-pass resonators are integrally formed by electroplated sheet metal material, and a part of each of the low-pass and band-pass resonators is coated with dielectric material, and wherein the two or more band-pass resonators are arranged at two sides of the inner cavity such that at least two resonators are aligned to face each other;

a first separator of electroplated sheet metal arranged in the inner cavity between the low-pass resonators and band-pass resonators;

a second separator of electroplated sheet metal arranged in the inner cavity between the band-pass resonators at the two sides of the inner cavity;

an input port to receive a signal to be filtered; and an output port to output a filtered signal.

14. The radio unit according to claim 13, wherein for each of the one or more integrated low-pass and band-pass filter units, the dielectric material is plastic, other polymer materials, or ceramic.

15. The radio unit according to claim 13, wherein for each of the one or more integrated low-pass and band-pass filter units further comprises a first coupling structure of the dielectric material, and wherein the first coupling structure is arranged between the two resonators facing each other, the first coupling structure is connected to the dielectric material coated part of the one resonator or to the dielectric material coated parts of both resonators.

16. The radio unit according to claim 15, wherein for each of the one or more integrated low-pass and band-pass filter units, the first coupling structure of the dielectric material is placed at a top of the two resonators facing each other, such that a negative coupling between the two resonators is achieved as a result of directions of electric fields generated by the two resonators being opposite.

17. The radio unit according to claim 16, wherein for each of the one or more integrated low-pass and band-pass filter units, the integrated low-pass and band-pass filter unit further comprises a second coupling structure, wherein the second coupling structure is placed at a bottom of two resonators such that a positive coupling between the two resonators is achieved as a result of directions of electric fields generated by the two resonators being the same.

18. The radio unit according to claim 14, wherein for each of the one or more integrated low-pass and band-pass filter units further comprises a first coupling structure of the dielectric material, and wherein the first coupling structure is arranged between the two resonators facing each other, the first coupling structure is connected to the dielectric material coated part of the one resonator or to the dielectric material coated parts of both resonators.

* * * * *